(12) United States Patent
Mahoney et al.

(10) Patent No.: US 10,128,837 B1
(45) Date of Patent: Nov. 13, 2018

(54) SYSTEM AND METHOD FOR IDENTIFYING OBJECTS USING CAPACITIVE SENSING TECHNOLOGY

(71) Applicant: Horizon Group USA, Inc., Warren, NJ (US)

(72) Inventors: Charles R. Mahoney, South Orange, NJ (US); Stephen Weiss, Easton, PA (US)

(73) Assignee: Horizon Group USA, INC, Warren, NJ (US)

( * ) Notice: Subject to any disclaimer, the term of this patent is extended or adjusted under 35 U.S.C. 154(b) by 0 days.

(21) Appl. No.: 16/005,350

(22) Filed: Jun. 11, 2018

(51) Int. Cl.
| | |
|---|---|
| *H03K 17/94* | (2006.01) |
| *H03K 17/96* | (2006.01) |
| *G01D 5/24* | (2006.01) |
| *H03K 17/955* | (2006.01) |
| *G06F 3/0354* | (2013.01) |
| *G06F 3/048* | (2013.01) |

(52) U.S. Cl.
CPC .......... *H03K 17/9622* (2013.01); *G01D 5/24* (2013.01); *G06F 3/03547* (2013.01); *G06F 3/048* (2013.01); *H03K 17/955* (2013.01)

(58) Field of Classification Search
CPC G06K 7/08; G06K 7/081; G06F 2203/04104; G06F 3/044
See application file for complete search history.

(56) References Cited

U.S. PATENT DOCUMENTS

| | | | |
|---|---|---|---|
| 6,132,281 A | 10/2000 | Klitsner et al. | |
| 6,353,168 B1 | 3/2002 | Sosoka, Jr. et al. | |
| 9,168,464 B2 | 10/2015 | Karunaratne | |
| 2006/0279174 A1* | 12/2006 | Oliver | B06B 1/0292 310/338 |
| 2008/0236374 A1 | 10/2008 | Kramer | |
| 2009/0308924 A1 | 12/2009 | Wallace et al. | |
| 2009/0318229 A1 | 12/2009 | Zielinski et al. | |
| 2012/0212241 A1 | 8/2012 | Wallace et al. | |
| 2014/0267189 A1 | 9/2014 | Moll | |
| 2015/0114210 A1 | 4/2015 | Ho | |
| 2015/0286294 A1 | 10/2015 | Kopcke et al. | |
| 2016/0210484 A1 | 7/2016 | Shi et al. | |
| 2017/0308777 A1 | 10/2017 | Funke | |
| 2017/0308778 A1 | 10/2017 | Foerster | |
| 2017/0337462 A1 | 11/2017 | Thiele | |

FOREIGN PATENT DOCUMENTS

| | | |
|---|---|---|
| EP | 2911756 | 9/2015 |
| WO | WO 2016/050950 | 4/2016 |
| WO | 2016124584 A2 | 8/2016 |

OTHER PUBLICATIONS

International Search Report and Written Opinion dated Sep. 10, 2018 for International Application No. PCT/US2018/038564.

* cited by examiner

*Primary Examiner* — Omeed Alizada
(74) *Attorney, Agent, or Firm* — Hunton Andrews Kurth LLP

(57) ABSTRACT

Embodiments disclosed herein provide for an improved system and method of identifying objects using capacitive sensing technology. Embodiments provide for a sensing array including a plurality of capacitive sensor pads, as well as a microcontroller configured to detect and identify the plurality of objects. Embodiments further provide for encoding each of the plurality of objects with a unique ternary code.

18 Claims, 4 Drawing Sheets

System 100

FIG. 3

SYSTEM AND METHOD FOR IDENTIFYING OBJECTS USING CAPACITIVE SENSING TECHNOLOGY

TECHNICAL FIELD

The present application relates to an improved system and method of identifying objects using capacitive sensing technology.

BACKGROUND

Capacitive sensing relies on the electrical concept of a parallel-plate capacitor, where the total capacitance is dependent on (i) the area of the two parallel plates, (ii) the distance between the two parallel plates, and (iii) the dielectric constant of the material in between the two plates, e.g., $$C = \frac{\varepsilon_r}{d} A.$$

In many capacitive sensing applications, the human body forms one plate of the capacitor referenced to a virtual ground. Capacitive sensing is typically used to detect the presence of a human finger (or fingers) and, based on this detection, cause some action to take place. In its simplest form, the capacitive sensor replaces a mechanical switch, thus eliminating the failures typical of mechanical devices and providing a more design-friendly user interface for a product. Capacitive sensing can also be used in industrial applications as proximity detectors, e.g., to sense the presence or absence of an object on a conveyor belt. However, capacitive sensing technologies do not generally provide object recognition and identification capabilities. Instead, if a designer requires a non-contact and non-mechanical method of uniquely identifying an object, other technologies such as radiofrequency identification (RFID), near-field communication (NFC), optical scanning (e.g., bar codes, QR codes, etc.), or image recognition are utilized. Such technologies are generally cost-prohibitive and are therefore not utilized in most toy applications.

Accordingly, there is a need for a low-cost method of identifying multiple objects placed on the surface of a toy that does not require an electro-mechanical interface (e.g., physical switch or switches).

BRIEF DESCRIPTION OF THE DRAWINGS

FIG. 3 illustrates possible ternary codes and corresponding decimal equivalents for the objects depicted in FIGS. 2B and 2C.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide an improved system and method of identifying objects using capacitive sensing technology. The methods herein address at least one of the problems discussed above.

According to an embodiment, a system for identifying a plurality of objects using capacitive sensing includes (i) a sensing array, wherein: the sensing array includes a plurality of capacitive sensor pads; and each of the plurality of objects includes at least one conductive surface, the at least one conductive surface being configured to form at least one capacitance with at least one one of the plurality of capacitive sensor pads; and (ii) a microcontroller, wherein the microcontroller is configured to (a) detect the at least one capacitance between each of the plurality of objects and the plurality of capacitive sensor pads and (b) identify each of the plurality of objects based on the detected at least one capacitance, wherein each of the plurality of objects are identified with a ternary code.

According to an embodiment, a method for identifying a plurality of objects using capacitive sensing includes forming at least one capacitance between at least one conductive surface of one of the plurality of objects and at least one of a plurality of capacitive sensor pads of a sensing array; detecting, with a microcontroller, the at least one capacitance between the one of the plurality of objects and the plurality of capacitive sensor pads; and identifying, with the microcontroller, the one of the plurality of objects based on the detected at least one capacitance, wherein the one of the plurality of objects is identified with a ternary code.

Figure 1:
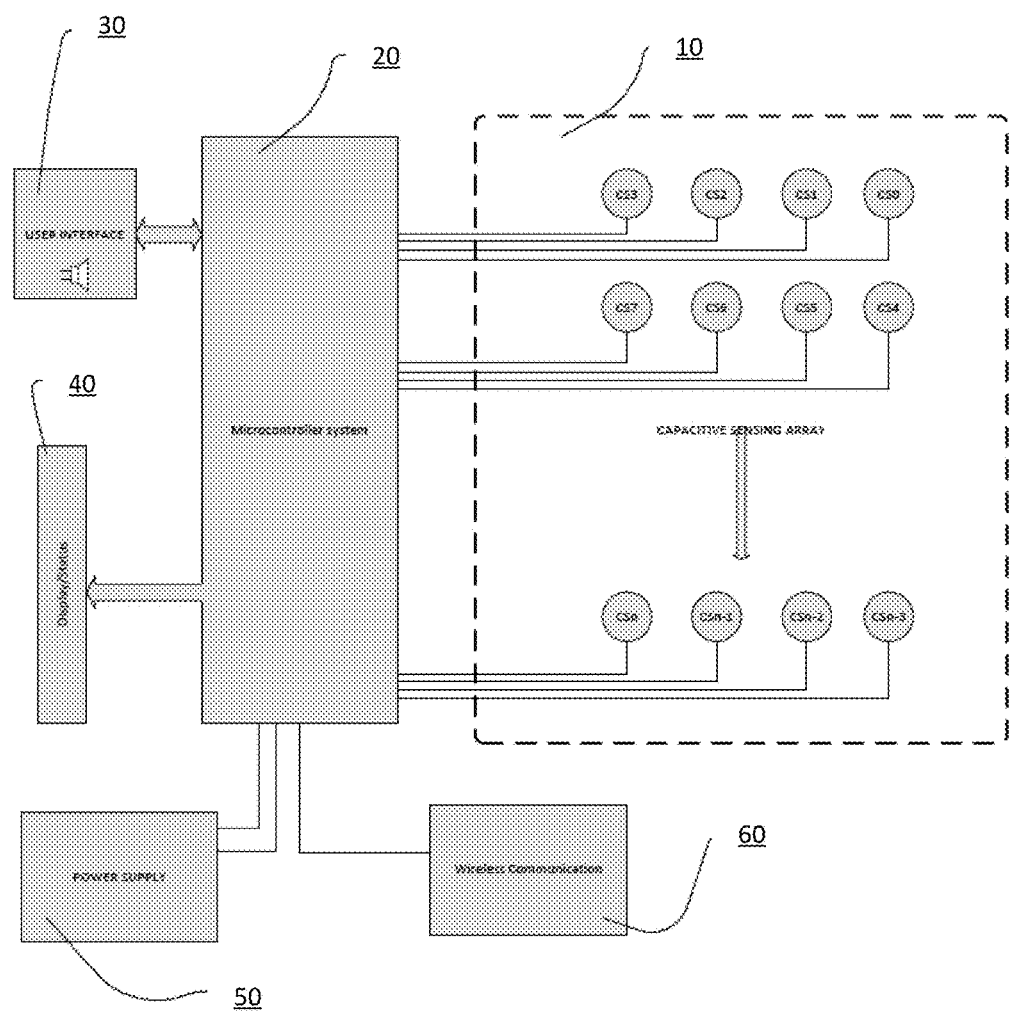
FIG. 1 illustrates an example embodiment of a capacitive sensing system.

FIG. 1 illustrates an example embodiment of a capacitive sensing system. As depicted in the figure, a capacitive sensing system 100 includes a capacitive sensing array 10, a microcontroller system 20, a user interface 30, display/status electronics 40, power supply 50, and a wireless communication subsystem 60. In an embodiment, the capacitive sensing array 10 includes a plurality of capacitive sensor pads CS. For example, the capacitive sensing array 10 includes capacitive sensor pads CS0 to CSn. In an embodiment, the microcontroller subsystem 20 may include either a 16 bit or 32 bit microcontroller. Further, the microcontroller includes software libraries for capacitive sensing that enable access to raw capacitance data, sensor calibration and baseline routines, scanning routines, and sensitivity adjustment routines. In an embodiment, the user interface 30 may include buttons, switches and/or keypads in order to accept user input. Further, the user interface 30 may also include a loudspeaker or transducer in order to provide audible feedback. In an embodiment, the display/status electronics 40 may include an active display such as a liquid-crystal display (LCD) or an organic light-emitting diode (OLED). Further, in an embodiment, the active display may be color or monochrome. In another embodiment, the display/status electronics 40 may also include light-emitting diode (LED) indicators. In an embodiment, the display/status electronics 40 may display information to the user based on the user's interaction with the user interface 30. In an embodiment, the power supply 50 may be a battery based on dry cells. In another embodiment, the power supply 50 may be a rechargeable battery, e.g., lithium ion (Li-ion). In an embodiment, the wireless communication subsystem 60 may be a wireless communication based on Bluetooth low energy (BLE), WiFi, infrared (IR), or similar protocols. In an embodiment, the wireless communication subsystem 60 may be used to connect the capacitive sensing system 100 to another device, e.g., computer, mobile phone, etc. For example, the wireless communication subsystem 60 may be used to control a robotic device based on the identification of the plurality of objects.

Figure 2A:
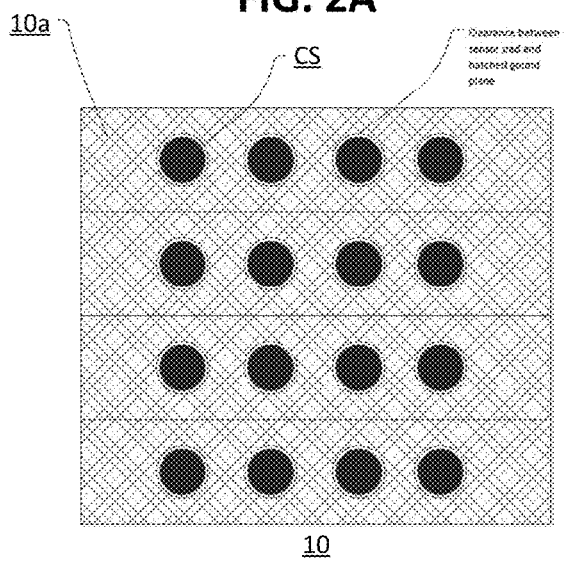
FIG. 2A illustrates an embodiment of the capacitive sensing array depicted in FIG. 1.

FIG. 2A illustrates an embodiment of the capacitive sensing array depicted in FIG. 1. In an embodiment, as depicted in the figure, the capacitive sensing array 10 includes a ground plane 10*a* and a plurality of capacitive sensor pads CS. The capacitive sensing array may also include a printed circuit board (PCB) (not shown). In an embodiment, the PCB is a non-conductive (i.e., insulating) substrate material. Further, the capacitive sensor pads CS are constructed on the PCB using conductive material. In an embodiment, the conductive material could be copper tape, pads on the PCB material, metal plates, conductive plastic, conductive paint, etc. Further, as depicted in the figure, the capacitive sensor pads CS each have a circular shape, thereby providing uniform capacitance values. However, in another embodiment, the capacitive sensor pads CS can also be square-shaped. In an embodiment, the dimensions of the capacitive sensor pads CS depend on a plurality of factors such as the physical size of the object to be identified as well as the number of capacitive sensor pads CS required. Further, as the area of the capacitive sensor pads CS decreases, so does the capacitance. Further, the capacitive sensor pads CS are connected to the microcontroller subsystem 20. However, traces (not shown) from the capacitive sensors pads CS to the microcontroller subsystem 20 are kept to a minimum to reduce the effect of the trace on the capacitive sensing. Further, the area of the capacitive sensor pad CS must be large when compared to the trace width. In addition, the arrangement of the capacitive sensor pads CS may be in any pattern or orientation that serves the intended purpose. For example, a rectangular object might be best served by having sensor pads arranged in a straight line, whereas a square object might require sensor pads in each corner. For instance, the arrangement of the capacitive sensor pads CS in FIG. 2A assumes that the object to be sensed is rectangular. As such, each object will be associated with four horizontally adjacent sensors arranged in a straight line. However, this number can be reduced or expanded as required. Further, sensors must be shielded from stray noise through use of a ground plane on both sides of the printed circuit board (e.g., the ground plane 10*a*); the ground plane may either be solid or hatched. For example, the ground plane 10*a* is hatched. Further, the ground plane 10*a* may be comprised of a conductive material, e.g., copper. In an embodiment, the ground plane 10*a* is located in a plane adjacent to the capacitive sensor pads CS and, therefore, surrounds the capacitive sensor pads CS. Further, as depicted in the figure, there may be a clearance between the capacitive sensor pads CS and the ground plane 10*a*.

Figure 2B:
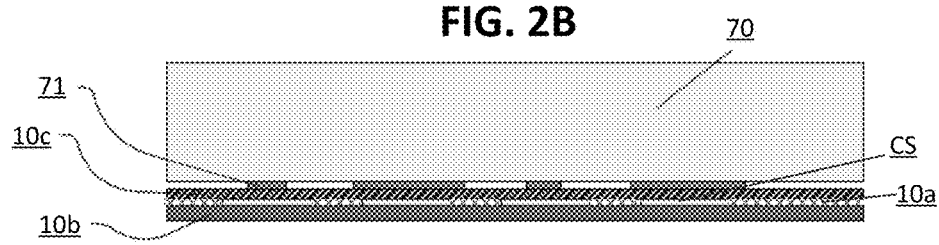
FIG. 2B illustrates an embodiment of an object to be sensed by the capacitive sensing system in FIG. 1.

FIG. 2B illustrates an embodiment of an object to be sensed by the capacitive sensing system in FIG. 1. As depicted in the figure, object 70 is block-shaped and includes a plurality of conductive surfaces 71. In an embodiment, each of the capacitive sensor pads CS may be associated with a corresponding conductive surface 71. In an embodiment, similar to the conductive material for the capacitive sensors CS, the plurality of conductive surfaces 71 may be one of copper tape, pads on PCB material, metal plates, conductive plastic, conductive paint, etc. As such, a capacitance may form between a particular capacitive sensor pad CS and a corresponding conductive surface 71. However, a capacitive sensor pad CS need not be associated with any conductive surface 71. In this case, no capacitance would form with the capacitive sensor pad CS. Accordingly, based on whether a capacitance forms with the capacitive sensor pad CS, it can be determined if a conductive surface 71 is located across from the particular capacitive sensor pad CS.

In an embodiment, the conductive surfaces 71 are mounted on an outside surface of the object, e.g., on a bottom surface of the object 70. Further, in an embodiment, the body of the object 70 is hollow. In another embodiment, the body of the object 70 may be solid. Further, the object 70 may include conductive surfaces 71 of different sizes. For example, the conductive surfaces 71 may have a surface area that is either larger or smaller than the surface area of a corresponding capacitive sensors CS. For example, in an embodiment, the surface area of the larger conductive surface 71 may be three times the size of the smaller conductive surface 71. In an embodiment, a conductive surface 71 with a larger surface area forms a larger capacitance with a corresponding capacitive sensor pad CS than a capacitance with a smaller surface area. For example, the conductive surface 71 with a larger surface area may form a capacitance that is three times larger than the conductive surface 71 with a smaller surface area. As such, based on the capacitance between the particular conductive surface 71 and the corresponding capacitive sensor pads CS, it can be determined which of the larger or smaller conductive surfaces 71 is being utilized.

In addition, FIG. 2B also depicts the ground plane 10*a*, a printed circuit board (PCB) 10*b*, and a device surface 10*c*. As described above, the PCB 10*b* is a non-conductive (i.e., insulating) substrate material. Further, the capacitive sensor pads CS are constructed on the PCB 10*b* using conductive material. Further, in an embodiment, the device surface 10*c* is a plastic layer enclosing the system 100. The plastic layer can be one of the variety of plastics used in children's toys. For example, the plastic may be one of acrylonitrile butadiene styrene (ABS) or polypropylene (PP).

Figure 2C:
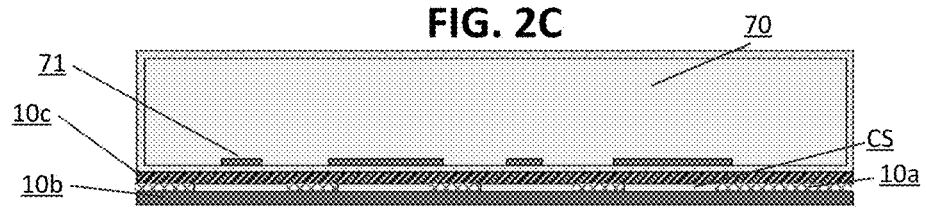
FIG. 2C illustrates another embodiment of the object depicted in FIG. 2B.

FIG. 2C illustrates another embodiment of the object depicted in FIG. 2B. In particular, unlike FIG. 2B, in which the conductive surfaces 71 are mounted on the outside of the object 70, the conductive surfaces 71 in FIG. 2C are mounted in the inside of the object 70, e.g., the bottom inside surface of the object 70.

Figure 2D:
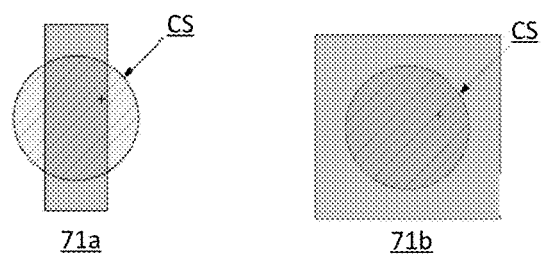
FIG. 2D illustrates embodiments of the conductive surfaces depicted in FIGS. 2B and 2C.

FIG. 2D illustrates embodiments of the conductive surfaces depicted in FIGS. 2B and 2C. In an embodiment, conductive surface 71*a* has a surface area smaller than the capacitive sensor CS, while conductive surface 71*b* has a surface area larger than the capacitive sensor CS.

In an embodiment, an object 70 can be identified by the system 100 based on the particular capacitances associated with each of the capacitive sensor pads CS. In an embodiment, each capacitive sensor pad CS can be associated with one of the three capacitance ranges: (i) capacitance associated with the conductive surface 71*a* (e.g., small surface area), (ii) capacitance associated with the conductive surface 71*b* (e.g., large surface area), and (iii) capacitance associated with no conductive surface 71. As such, utilizing the quantity and sizes of the conductive surfaces 71, as well as the location of the conductive surfaces 71 (and any locations parallel to a corresponding capacitive sensor without conductive surfaces 71), the object 70 can be uniquely encoded with a particular identification (ID). In particular, in an embodiment, because each of the capacitive sensor pads CS can be associated with three capacitive ranges, each of the objects 70 can be encoded utilizing ternary encoding. In an embodiment, unlike binary, which establishes two levels—zero and one—for each binary digit or "bit", ternary encodes each ternary digit, or "trit" with three levels—zero, one or two. The maximum number of possible codes for a given number of trits is given by $3^n$, and the highest decimal value is $3^{n-1}$. Thus, with two trits (i.e., two capacitive sensor pads CS), nine potential codes are possible with the highest code value being eight. In comparison, two binary digits would only encode $2^n$ values or four codes. As such, four capacitive sensor pads CS (as depicted in FIG. 2A), each object 70 can be encoded with four trits, with each trit being given a level of 0, 1, or 2. Accordingly, the total number of object codes possible is 81, with the highest value being 80. In an embodiment, the objects 70 can be encoded from left to right. In other words, the leftmost capacitive sensors pads CS in the capacitive sensor array 10 of FIG. 2A are associated with the least significant trit positions (e.g., trit 0), while the rightmost capacitive sensor pads CS are associated with the most significant trit positions (e.g., trit 3). However, in another embodiment, the encoding can be reversed, i.e., leftmost capacitive sensors pads CS are associated with the most significant trit positions (e.g., trit 3), while the rightmost capacitive sensor pads CS are associated with the least significant trit positions (e.g., trit 0). In an embodiment, if the least significant trit position, e.g., trit 0, does not include any conductive surfaces 71, then trit 0 will be given a level of 0. On the other hand, if trit 0 includes a conductive surface 71 having the smaller surface area, e.g., conductive surface 71a, then trit 0 will be given a level of 1. However, if trit 0 includes a conductive surface having the larger surface area, e.g., conductive surface 71b, then trit 0 will be given a level of 2. Then, based on the level (e.g., 0, 1, or 2) associated with each trit, a decimal equivalent can be determined. Specially, the decimal equivalent of trit is added together to determine a combined decimal equivalent. For example, the decimal equivalent for trit $0 = (level_0) \times 3^0$. As such, if the level for trit 0 is 0, then the decimal equivalent will also be 0. However, if the level for trit 0 is 1, then the decimal equivalent will also be 1. Similarly, if the level for trit 0 is 2, then the decimal equivalent will also be 2. As regards to trit 1, the decimal equivalent $=(level_1) \times 3^1$. As such, if the level for trit 1 is 0, then the decimal equivalent will also be 0. However, if the level for trit 1 is 1, then the decimal equivalent will be 3. Similarly, if the level for trit 1 is 2, then the decimal equivalent will also be 6. As regards to trit 2, the decimal equivalent $=(level_2) \times 3^2$. As such, if the level for trit 2 is 0, then the decimal equivalent will also be 0. However, if the level for trit 2 is 1, then the decimal equivalent will be 9. Similarly, if the level for trit 2 is 2, then the decimal equivalent will be 18. Further, as regards to trit 3, the decimal equivalent $=(level_3) \times 3^3$. As such, if the level for trit 3 is 0, then the decimal equivalent will also be 0. However, if the level for trit 3 is 1, then the decimal equivalent will be 27. Similarly, if the level for trit 3 is 2, then the decimal equivalent will be 54. Accordingly, the decimal equivalent for any object $70 = (level_3) \times 3^3 + (level_2) \times 3^2 + (level_1) \times 3^1 + (level_0) \times 3^0$ or $$\sum_{1}^{n}(level_{n-1})3^{n-1}.$$

Figure 3:
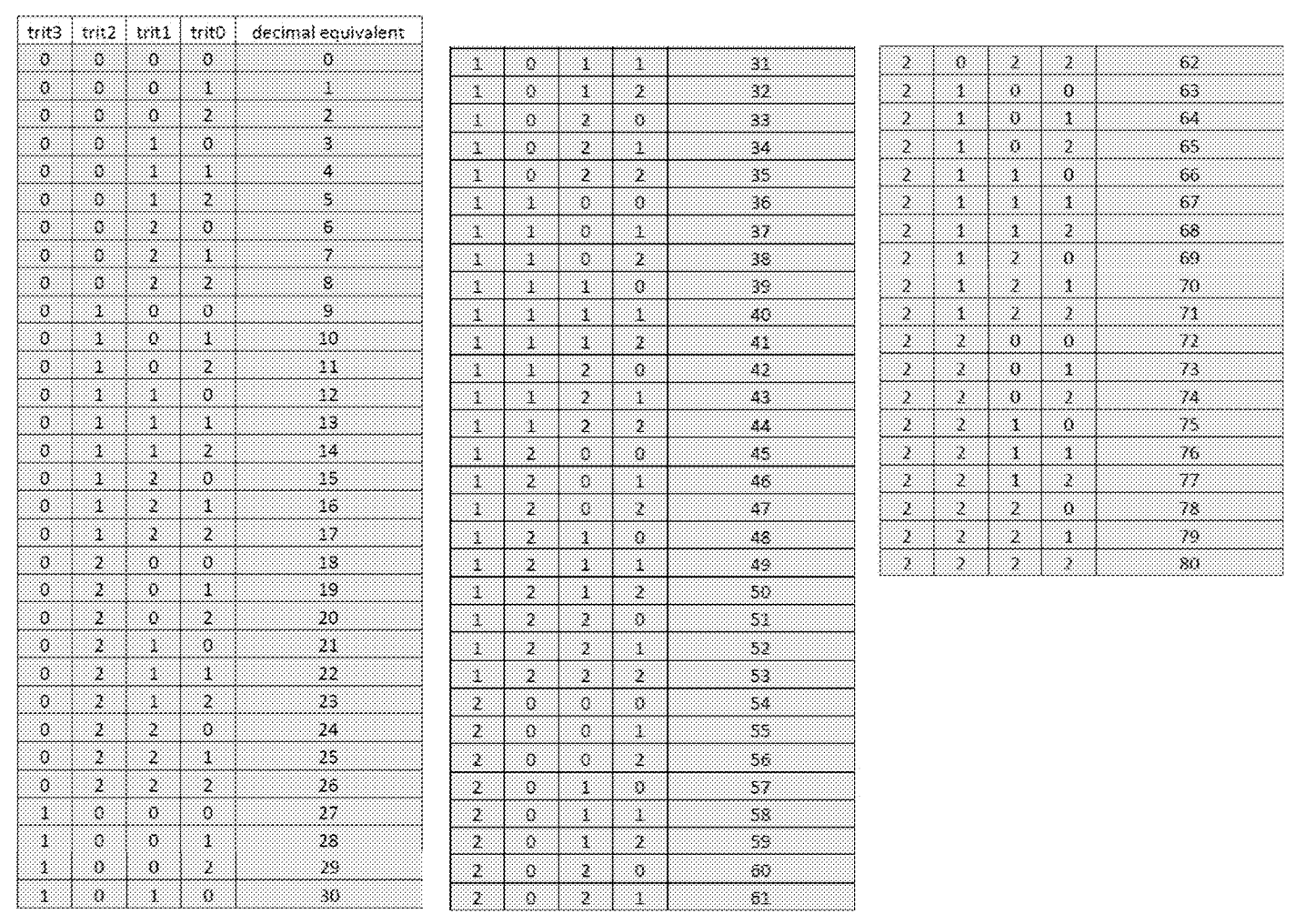

FIG. 3 illustrates the possible ternary codes and corresponding decimal equivalents for the object 70. For example, the object 70 in FIGS. 2B and 2C, which includes, from left to right, a conductive surface 71a, a conductive surface 71b, a conductive surface 71a, and a conductive surface 71b, respectively, would have a corresponding ternary code of 1212 and, therefore, a decimal equivalent of 50 (i.e., $(1) \times 3^3 + (2) \times 3^2 + (1) \times 3^1 + (2) \times 3^0$). Further, in an embodiment, the ternary codes can be utilized for a variety of different-numbered sensor applications. For example, as depicted in FIG. 3, the ternary codes associated with the decimal equivalents 0 to 8, respectively, can be utilized for two-sensor applications. Further, the ternary codes associated with the decimal equivalents 9 to 26, respectively, can be utilized for three-sensor applications. Lastly, the ternary codes associated with the decimal equivalents 27 to 80, respectively, can be utilized for four-sensor applications. In an embodiment, the number of trits used can be expanded or reduced depending on the number of capacitive sensor pads CS utilized.

Figure 4:
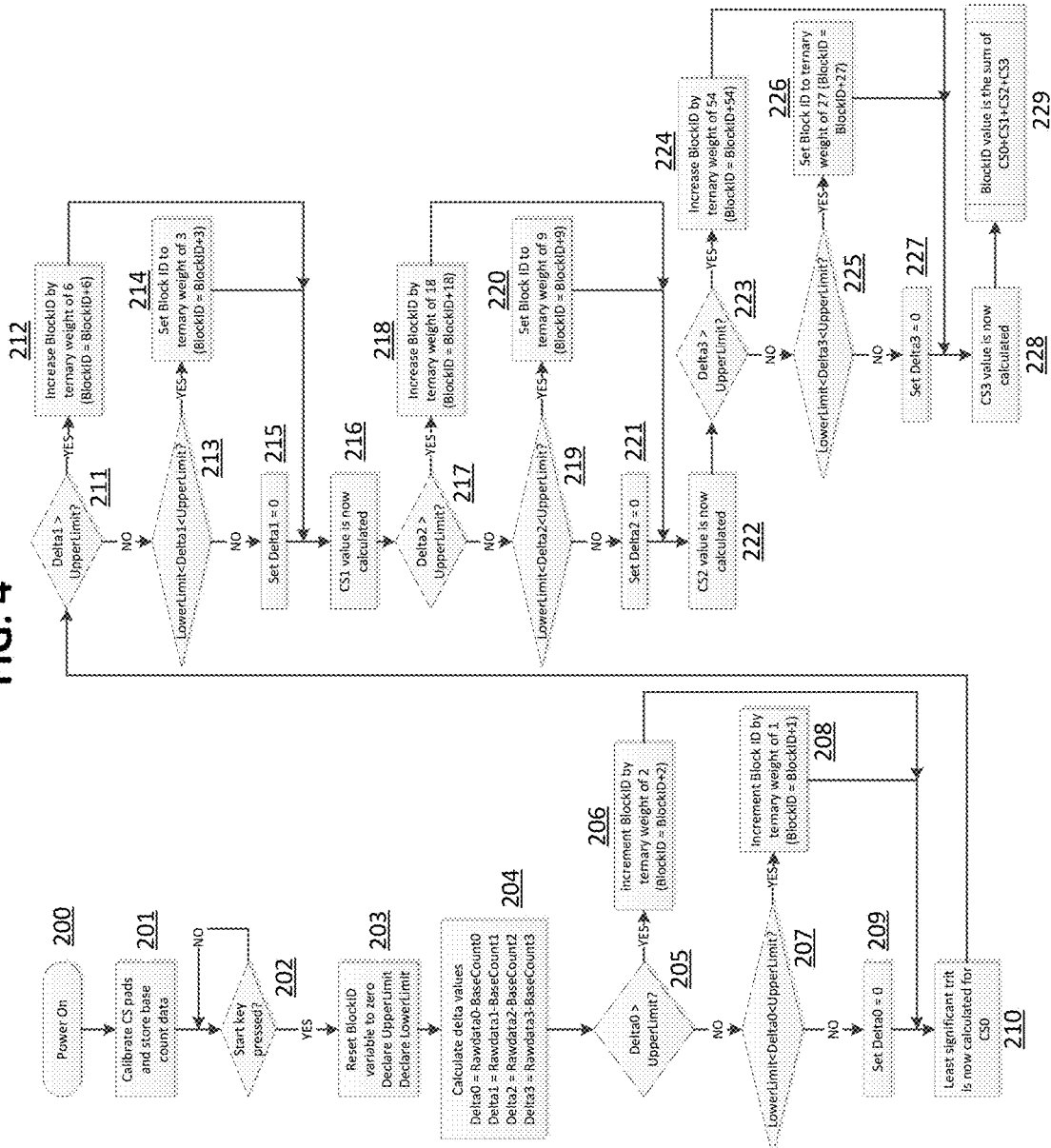
FIG. 4 illustrates an example embodiment of a method utilized to identify the objects depicted in FIGS. 2B and 2C.

FIG. 4 illustrates an example embodiment of a method utilized to identify the objects depicted in FIGS. 2B and 2C. In a first step, i.e., step 200, the system 100 is powered, e.g., via the power supply 50. In an embodiment, the system 100 may be powered by interacting (e.g., switching on) a power button located at the user interface 30. Further, in an embodiment, after the system 100 is powered, calibration signals (e.g., voltage signals) can be provided from the microcontroller subsystem 20 to the capacitive sensor pads CS in the sensing array 10. As such, the microcontroller subsystem 20 can then calibrate the base count capacitance for each of the capacitive sensor pads CS as depicted in step 201. For example, the microcontroller subsystem 20 can calibrate the capacitive sensors pads CS associated with trit 0, trit 1, trit 2, and trit 3, respectively. The calibrated base count capacitances for the capacitive sensors pads CS may then be stored in the microcontroller subsystem 20 for further processing. Then, in step 203, the system 100 waits until a user initiates the sensing operation, i.e., by pressing a start key/button. In an embodiment, the start key/button may also be located in the user interface 30. In an embodiment, if the start key/button is pressed, the ID associated with the object 70 (e.g., BlockID) is reset to zero as depicted in step 203. In an embodiment, the BlockID for a particular object 70 may be stored in a memory located at the microcontroller subsystem 20. Further, the microcontroller subsystem may also declare (and then store) the upper and lower capacitance limits associated with the larger and smaller conductive surfaces 71, e.g., UpperLimit and LowerLimit, respectively. For example, UpperLimit may be associated with the larger conductive surface 71 (i.e., 71b) capacitance and the LowerLimit may be associated with the smaller conductive surface 71 (i.e., 71a) capacitance. Further, in an embodiment, the UpperLimit capacitance may be three times larger than the LowerLimit capacitance. Then, the microcontroller subsystem 20 may read the raw capacitance data at the capacitive sensors pads CS associated with trit 0, trit 1, trit 2, and trit 3, e.g., Rawdata0, Rawdata1, Rawdata2, and Rawdata3, respectively. Then, as depicted in step 204, the microcontroller subsystem 20 may calculate the capacitance difference (i.e., delta values Delta0, Delta1, Delta 2, and Delta3) between the received raw data (e.g., Rawdata0, Rawdata1, Rawdata2, Rawdata3) and the base count (e.g., BaseCount0, BaseCount1, BaseCount2, BaseCount3) for each capacitive sensor pad CS. Then, as depicted in steps 205 to 228, the microcontroller compares the delta value at each capacitive sensor pad CS to the UpperLimit and LowerLimit to determine the decimal equivalent (e.g., ternary weight) of the trit associated the particular capacitive sensor pad CS. For example, as depicted in step 205, the microcontroller subsystem 20 compares Delta0 (i.e., Rawdata0−BaseCount0) to UpperLimit. If it is determined that Delta0 is greater than UpperLimit, than the BlockId for that particular object is incremented by 2 (i.e., BlockID=BlockID+2) as depicted in step 206. However, if Delta0 is not greater than the UpperLimit, then the method proceeds to step 207, where Delta0 is compared to LowerLimit as well. If it is determined that Delta0 is less than UpperLimit but greater than LowerLimit, then the BlockId for that particular object is incremented by 1 (i.e., BlockID=BlockID+1) as depicted in step 208. However, if Delta® is less than UpperLimit and LowerLimit, then Delta0 is set to "0" as depicted in step 209 and, therefore, BlockID will not be incremented. Accordingly, as depicted in step 201, the decimal equivalent at the capacitive sensor pad CS associated with the least significant trit (i.e., CS0) is determined and, therefore, can be stored in the memory for further processing. Then, in step 211, the microcontroller subsystem 20 compares Delta1 (i.e., Rawdata1−BaseCount1) to UpperLimit. If it is determined that Delta1 is greater than UpperLimit, than the BlockId for that particular object is incremented by 6 (i.e., BlockID=BlockID+6) as depicted in step 212. However, if Delta1 is not greater than the UpperLimit, then the method proceeds to step 213, where Delta0 is compared to LowerLimit as well. If it is determined that Delta1 is less than UpperLimit but greater than LowerLimit, then the BlockId for that particular object is incremented by 3 (i.e., BlockID=BlockID+3) as depicted in step 214. However, if Delta1 is less than UpperLimit and LowerLimit, then Delta1 is set to "0" as depicted in step 215 and, therefore, BlockID will not be incremented. Accordingly, as depicted in step 216, the decimal equivalent at the capacitive sensor pad CS associated with the second least significant trit (i.e., CS1) is determined and, therefore, can be stored in the memory for further processing. Then, in step 217, the microcontroller subsystem 20 compares Delta2 (i.e., Rawdata2-BaseCount2) to UpperLimit. If it is determined that Delta2 is greater than UpperLimit, than the BlockId for that particular object is incremented by 18 (i.e., BlockID=BlockID+18) as depicted in step 218. However, if Delta2 is not greater than the UpperLimit, then the method proceeds to step 219, where Delta2 is compared to LowerLimit as well. If it is determined that Delta2 is less than UpperLimit but greater than LowerLimit, then the BlockId for that particular object is incremented by 9 (i.e., BlockID=BlockID+9) as depicted in step 220. However, if Delta2 is less than UpperLimit and LowerLimit, then Delta2 is set to "0" as depicted in step 221 and, therefore, BlockID will not be incremented. Accordingly, as depicted in step 222, the decimal equivalent at the capacitive sensor pad CS associated with the second most significant trit (i.e., CS2) is determined and, therefore, can be stored in the memory for further processing. Then, in step 223, the microcontroller subsystem 20 compares Delta3 (i.e., Rawdata3-BaseCount3) to UpperLimit. If it is determined that Delta3 is greater than UpperLimit, than the BlockId for that particular object is incremented by 54 (i.e., BlockID=BlockID+18) as depicted in step 224. However, if Delta3 is not greater than the UpperLimit, then the method proceeds to step 225, where Delta3 is compared to LowerLimit as well. If it is determined that Delta3 is less than UpperLimit but greater than LowerLimit, then the BlockId for that particular object is incremented by 27 (i.e., BlockID=BlockID+27) as depicted in step 226. However, if Delta3 is less than UpperLimit and LowerLimit, then Delta3 is set to "0" as depicted in step 227 and, therefore, BlockID will not be incremented. Accordingly, as depicted in step 228, the decimal equivalent at the capacitive sensor pad CS associated with the most significant trit (i.e., CS3) is determined and, therefore, can be stored in the memory for further processing. In an embodiment, as depicted in step 229, the BlockID value is then determined by adding the values stored for CS0, CS1, CS2, and CS3. In an embodiment, the decimal equivalent for each of CS0, CS1, CS2, and CS3 is determined sequentially. However, in another embodiment, the decimal equivalent for each of CS0, CS1, CS2, and CS3 can be determined simultaneously. Further, in an embodiment, the system 100 can use the above method to identify a plurality of objects 70. For example, the above method can be used to identify a second object with capacitive sensors CS4, CS5, CS6, CS7. Similarly, a nth object can be identified with capacitive sensors CSn−3, CSn−2, CSn−1, and CSn. Further, in an embodiment, the plurality of objects can either be detected sequentially or simultaneously.

In an embodiment, after identifying each of the plurality of objects, the microcontroller subsystem 20 can determine if the plurality of objects are placed in the correct sequential order by comparing the placement of the plurality of objects 70 to a preferred placement. For example, the preferred placement may require that: a first block is placed over the area including capacitive sensors CS0 to CS3, a second block is placed over the area including capacitive sensors CS4 to CS7, . . . and a nth block is placed over the area including CSn−3 to CSn. In an embodiment, the preferred placement may be stored in memory in the microcontroller subsystem 20. In an embodiment, the system 100 may indicate correct or incorrect placement of the objects 70 through audible feedback at the user interface, e.g., via the loudspeaker or transducer. For example, if after the comparison, it is determined that the placement was correct, the loudspeaker or transducer may produce a noise indicating approval. On the other hand, if after the comparison, it is determined that the placement was incorrect, the loudspeaker or transducer may produce a noise indicating disapproval. In another embodiment, approval and/or disapproval may also be indicated with the display/status electronics 40. For example, approval may be indicated by flashing the LED indicators with a first color (e.g., green) and disapproval may be indicated by flashing the LED indicators with a second color (e.g., red). Further, in another embodiment, the approval and/or disapproval may be indicated by a message (e.g., "CORRECT," "WRONG," etc.) appearing on the active display.

Further, in an embodiment, after it is determined that the placement was correct, the system 100 can transmit, via the wireless communication subsystem 60, instructions from the microcontroller subsystem 20 to another device. In an embodiment, the other device may be a robotic device, e.g., toy.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of Embodiments, with each claim standing on its own as a separate embodiment of the invention.

Moreover, it will be apparent to those skilled in the art from consideration of the specification and practice of the present disclosure that various modifications and variations can be made to the disclosed systems without departing from the scope of the disclosure, as claimed. Thus, it is intended that the specification and examples be considered as exemplary only, with a true scope of the present disclosure being indicated by the following claims and their equivalents.

The invention claimed is:

1. A system for identifying a plurality of objects using capacitive sensing, the system comprising:
a sensing array, wherein:
the sensing array includes a plurality of capacitive sensor pads; and
each of the plurality of objects includes at least one conductive surface, the at least one conductive surface being configured to form at least one capacitance with at least one of the plurality of capacitive sensor pads; and
a microcontroller, wherein the microcontroller is configured to (i) detect the at least one capacitance between each of the plurality of objects and the plurality of capacitive sensor pads and (ii) identify each of the plurality of objects based on the detected at least one capacitance, wherein each of the plurality of objects are identified with a ternary code, wherein (i) a first ternary code level is associated with a conductive surface including a surface area larger than a surface area of the at least one of the plurality of capacitive sensor pads and (ii) a second ternary code level is associated with a conductive surface including a surface area smaller than the surface area of the at least one of the plurality of capacitive sensor pads.

2. The system of claim 1, wherein the at least one conductive surface includes a surface area that is one of (i) larger than a surface area of the at least one of the plurality of capacitive sensor pad and (ii) smaller than the surface area of the at least one of the plurality of capacitive sensor pad.

3. The system of claim 1, wherein a third ternary code level is associated with a location in the object without any conductive surfaces.

4. The system of claim 1, wherein the at least one conductive surface is mounted on an outside surface of the object.

5. The system of claim 1, wherein the at least one conductive surface is mounted on an inside surface of the object.

6. The system of claim 1, wherein the object is one of: (i) solid and (ii) hollow.

7. The system of claim 1, wherein the plurality of objects are one of: (i) identified sequentially and (ii) identified simultaneously.

8. The system of claim 7, wherein, upon identifying the plurality of the objects, the microcontroller is configured to determine if the plurality of objects are placed in a correct sequential order by comparing a placement of the plurality of objects to a preferred placement.

9. The system of claim 8, further comprising:
a user interface, wherein the user interface is configured to (i) receive user input and (ii) indicate at least one of correct and incorrect placement of the plurality of objects.

10. The system of claim 8, further comprising:
a display, wherein the display is configured to indicate at least one of correct and incorrect placement of the plurality of objects.

11. The system of claim 8, further comprising:
a wireless communication system, wherein the wireless communication system is configured to transmit instructions from the microcontroller to another device based on the correct placement of the plurality of objects.

12. A method for identifying a plurality of objects using capacitive sensing, the method comprising:
forming at least one capacitance between at least one conductive surface of one of the plurality of objects and at least one of a plurality of capacitive sensor pads of a sensing array;
detecting, with a microcontroller, the at least one capacitance between the one of the plurality of objects and the plurality of capacitive sensor pads; and
identifying, with the microcontroller, the one of the plurality of objects based on the detected at least one capacitance, wherein the one of the plurality of objects is identified with a ternary code, wherein (i) a first ternary code level is associated with a conductive surface including a surface area larger than a surface area of the at least one of the plurality of capacitive sensor pads and (ii) a second ternary code level is associated with a conductive surface including a surface area smaller than the surface area of the at least one of the plurality of capacitive sensor pads.

13. The method of claim 12, wherein the at least one conductive surface includes a surface area that is one of (i) larger than a surface area of the at least one of the plurality of capacitive sensor pad and (ii) smaller than the surface area of the at least one of the plurality of capacitive sensor pad.

14. The method of claim 12, wherein a third ternary code level is associated with a location in the object without any conductive surfaces.

15. The method of claim 12, wherein the identifying includes:
comparing the detected at least one capacitance to at least one of an upper limit and a lower limit; and
determining a ternary code level for the detected at least one capacitance based on the comparison, wherein:
the first ternary code level is determined if the detected at least one capacitance is greater than the upper limit;
the second ternary code level is determined if the detected at least one capacitance is less than the upper limit but greater than the lower limit, and
a third ternary code level is determined if the detected at least one capacitance is less than the upper limit and the lower limit.

16. The method of claim 12, wherein the plurality of objects are one of: (i) identified sequentially and (ii) identified simultaneously.

17. The method of claim 16, further comprising:
upon identifying the plurality of the objects, determining, with the microcontroller, if the plurality of objects are placed in a correct sequential order by comparing a placement of the plurality of objects to a preferred placement.

18. The method of claim 17, further comprising:
transmitting, with a wireless communication system, instructions from the microcontroller to another device based on the correct placement of the plurality of objects.

* * * * *